US010287723B2

(12) United States Patent
James

(10) Patent No.: US 10,287,723 B2
(45) Date of Patent: May 14, 2019

(54) LAUNDRY WASHING MACHINE WITH SPEECH RECOGNITION AND RESPONSE LAUNDRY WASHING MACHINE WITH SPEECH RECOGNITION AND RESPONSE CAPABILITIES, IN PARTICULAR SPEECH RESPONSE, AND A METHOD FOR OPERATING THEREOF

(71) Applicant: Saronikos Trading and Services, Unipessoal Lda, Funchal, Madeira (PT)

(72) Inventor: Robert James, Hatfield (GB)

(73) Assignee: Saronikos Trading and Services, Unipessoal LDA, Funchal, Madeira (PL)

( * ) Notice: Subject to any disclaimer, the term of this patent is extended or adjusted under 35 U.S.C. 154(b) by 324 days.

(21) Appl. No.: 15/029,277

(22) PCT Filed: Oct. 16, 2013

(86) PCT No.: PCT/EP2013/071597
§ 371 (c)(1),
(2) Date: Apr. 14, 2016

(87) PCT Pub. No.: WO2015/055239
PCT Pub. Date: Apr. 23, 2015

(65) Prior Publication Data
US 2016/0258104 A1 Sep. 8, 2016

(51) Int. Cl.
*G10L 15/00* (2013.01)
*D06F 39/00* (2006.01)
(Continued)

(52) U.S. Cl.
CPC .......... *D06F 39/005* (2013.01); *D06F 35/005* (2013.01); *G05B 19/042* (2013.01);
(Continued)

(58) Field of Classification Search
None
See application file for complete search history.

(56) References Cited

U.S. PATENT DOCUMENTS

| | | | |
|---|---|---|---|
| 4,520,576 | A | 6/1985 | Vander Molen |
| 2001/0042391 | A1 | 11/2001 | Wobkemeier |

(Continued)

FOREIGN PATENT DOCUMENTS

| | | |
|---|---|---|
| CN | 101484626 | 7/2009 |
| CN | 101886322 | 11/2010 |

(Continued)

OTHER PUBLICATIONS

Chinese Office Action dated Jul. 5, 2017, issued in Chinese Application No. 201380080286.3.

(Continued)

*Primary Examiner* — Ali Naraghi
(74) *Attorney, Agent, or Firm* — Workman Nydegger

(57) ABSTRACT

A laundry washing machine with a human interface configured to receive information, specifying for each item, introduced into the washing machine to be washed, essential information including a typology and a description of its characteristics. The laundry washing machine also has a memory means configured to memorize the essential information, and a data management means configured to use said information to determine the most appropriate washing program among multiple washing programs, chosen taking into account the items singularly specified through said essential information when they are introduced in said washing machine. The data management means is also configured to report to a user, by means of an output means, the presence of at least a conflicting laundry item into the washing machine, after having determined on the basis of said essential information which conflicting laundry item is (Continued)

unsuitable to be washed by means of the selected washing program.

20 Claims, 3 Drawing Sheets

(51) Int. Cl.
    *D06F 35/00*     (2006.01)
    *G05B 19/042*     (2006.01)
    *G06F 3/048*     (2013.01)
    *G06F 3/0488*     (2013.01)
    *G06F 3/16*     (2006.01)
    *H03M 1/12*     (2006.01)
    *H03M 1/66*     (2006.01)
    *D06F 33/02*     (2006.01)

(52) U.S. Cl.
    CPC ............ *G06F 3/048* (2013.01); *G06F 3/0488* (2013.01); *G06F 3/16* (2013.01); *H03M 1/12* (2013.01); *H03M 1/66* (2013.01); *D06F 33/02* (2013.01); *D06F 39/003* (2013.01); *D06F 2210/00* (2013.01); *G05B 2219/2633* (2013.01)

(56) References Cited

U.S. PATENT DOCUMENTS

| | | | | |
|---|---|---|---|---|
| 2004/0117843 | A1* | 6/2004 | Karaoguz | H04L 12/2803 725/108 |
| 2007/0176786 | A1* | 8/2007 | Yamamoto | H04L 12/2803 340/4.3 |
| 2010/0268335 | A1* | 10/2010 | Yang | A61L 15/18 623/11.11 |

FOREIGN PATENT DOCUMENTS

| | | |
|---|---|---|
| CN | 102517842 A | 6/2012 |
| CN | 202830556 U | 3/2013 |
| DE | 39 10 763 | 10/1990 |
| DE | 198 10 907 | 9/1999 |
| EP | 0 548 697 | 6/1993 |
| EP | 1 225 267 | 7/2002 |
| JP | 2002-355486 A | 12/2002 |
| KR | 10-213-0020375 | 2/2013 |
| WO | WO 2004/055256 | 7/2004 |
| WO | WO 2008/00812 | 1/2008 |

OTHER PUBLICATIONS

Chinese Search Report dated Jun. 27, 2017, issued in Chinese Application No. 201380080286.3.
Office Action dated Mar. 21, 2017, issued in Korean Application No. KR 10-2016-7012422.
International Search Report for Application No. PCT/EP2013/071597 dated Apr. 15, 2014.
A Chinese first Office Action dated Nov. 2, 2016 for corresponding Chinese patent application No. 201380080286.2.
A Search Report dated Oct. 26, 2016 regarding the corresponding Chinese patent application No. 201380080286.2.

* cited by examiner

LAUNDRY WASHING MACHINE WITH SPEECH RECOGNITION AND RESPONSE LAUNDRY WASHING MACHINE WITH SPEECH RECOGNITION AND RESPONSE CAPABILITIES, IN PARTICULAR SPEECH RESPONSE, AND A METHOD FOR OPERATING THEREOF

The present application claims priority from International Patent Application No. PCT/EP2013/071597 filed on Oct. 16, 2013, the disclosure of which is incorporated herein by reference in its entirety.

FIELD OF THE INVENTION

It is noted that citation or identification of any document in this application is not an admission that such document is available as prior art to the present invention.

The present invention relates to a laundry washing or washing/drying machine with speech recognition and response capabilities, in particular speech response, and a method for operating thereof.

The problem has always existed of washing a laundry mixture composed of different types of clothes without damaging the individual items of laundry, such problem has been a challenge for designers of laundry washing machines. An example of a solution to this technical problem is given by the German patent application DE 39 10 763 in the name of Licentia. Even if the washing machine described in said German patent application has speech recognition capabilities, quite advanced at the time of filing this application, 1989, the problem of washing a mixture of laundry composed of different type of clothes is solved in a very poor manner and even today has not been solved in a satisfactory manner. In fact, in the presence of different types of laundry, like bed linen, towels, colored cotton items, undergarments and the like, the washing program, selected by the washing machine, provides for making the most delicate treatment in accordance with the most delicate category of laundry inserted in the tub of the washing machine, i.e. undergarments or colored cotton items.

In other words, even if together with a silk shirt bed linen is among the items to be washed, that normally requires a much more thorough washing program, such as 90°, the program selected by the machine is the one that, from among those that could be the most appropriate for the different type of laundry, guarantees the washing temperature, or the agitation of the clothes in the tub, or the drying spinning speed, or the quantity of detergent, or all of the above, which is the lower one in relation to the most delicate item inserted in the tub.

It is to be noted that the solution, given from the German patent application, i.e. that it is enough to have a wash program including a pre-wash, in order to ensure an intense cleansing action, does not work. In fact every person skilled in the art of laundry washing machines knows that the three principal factors influencing laundry washing are: temperature, agitation of the items, and detergent. If the temperature, or the agitation, or the quantity of detergent are not sufficient, laundry can be washed even for a very long period of time, but the result will still be very poor.

A further solution of the prior art system is given by US 2001/042391 in the name of BSH Bosch Siemens that comprises an automatic washing machine that is able to propose a washing program to a user based on the typologies of fabrics placed within the drum machine by way of a spectrometer sensor. However the technology of using a spectrometer sensor for determining a washing program does not provide an advantageous solution for the user, inasmuch such sensors are only able to recognize the fabrics of the items and not the items themselves. This system obviously has drawbacks inasmuch as cotton fabric, for instance, may be used for bed linen, shirts, undergarments, handkerchiefs, etc. and the machine would only recognize the fabric as being cotton and then propose a program based on such typology of fabric. It is known that bed linen, shirts, undergarments and handkerchiefs require distinct washing programs. Moreover, this solution does not take into consideration the level of dirtiness and the color degree (intensity) of the items introduced in the drum of the wash-tub.

SUMMARY OF THE INVENTION

It is therefore an aim of the present invention to indicate an automatic laundry washing machine with speech recognition and response capabilities, in particular speech response and a method for operating thereof which do not suffer the drawbacks of the prior art.

This and other aims of the present invention are reached by way of an automatic laundry washing or washing/drying machine with speech recognition and response capabilities, in particular speech response and a method for operating thereof as claimed in the annexed claims that constitute an integral part of the present description.

In synthesis, the fundamental idea of the present invention relates to a laundry washing or washing/drying machine (1) comprising:
 a wash tub,
 an human interface device apt to receive by a user information regarding the items to be washed, in particular comprising a microphone suitable for transducing the voice of the user in electrical signals;
 a control unit which is in communication with said human interface device, and comprises:
  memory means containing at least a set of washing programs and instructions for controlling the operation of said machine,
  data management means configured for acquiring information about laundry items introduced into the wash tub and for selecting a washing program from said set of washing programs on the basis of said information about the laundry items,
 output means which are in communication with the control unit, characterized in that the human interface is apt to receive information, specifying for each item the user introduces into the wash tub to be washed, essential information comprising a typology (bed linen, shirts, underwear, etc.) and a description of its characteristics, in particular the type of fabric, the degree of soil, the color and its intensity, wherein said memory means is apt to memorize the said essential information and wherein the data management means is configured for using said information for determining the most appropriate washing program among said set of washing programs, chosen taking into account the items singularly specified through said essential information when they are introduced in said wash tub and wherein the data management means are also configured for reporting to the user, by means of said output means, the presence of at least a conflicting laundry item into the wash tub, after having determined on the basis of said essential information which conflicting laundry item is unsuitable to be washed by means of the selected washing program.

The present invention also refers to a method used for controlling the above said automatic laundry washing or washing/drying machine.

Further objects, features and advantages of the present invention will become apparent from the following detailed description and from the annexed drawings, which are supplied by way of a non-limiting example.

DETAILED DESCRIPTION OF EMBODIMENTS

It is to be understood that the figures and descriptions of the present invention have been simplified to illustrate elements that are relevant for a clear understanding of the present invention, while eliminating, for purposes of clarity, many other elements which are conventional in this art. Those of ordinary skill in the art will recognize that other elements are desirable for implementing the present invention. However, because such elements are well known in the art, and because they do not facilitate a better understanding of the present invention, a discussion of such elements is not provided herein.

The present invention will now be described in detail on the basis of exemplary embodiments.

Figure 1:
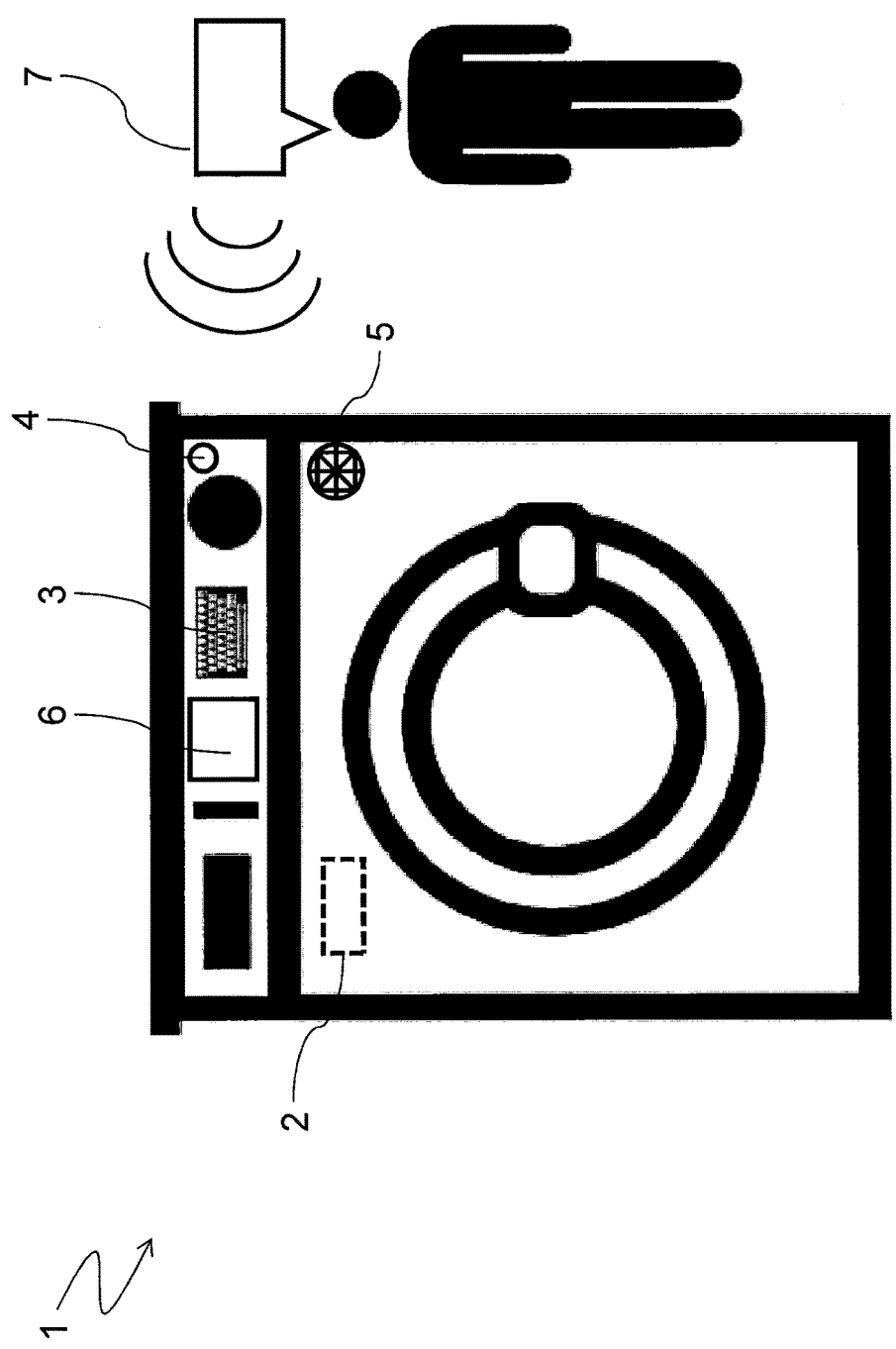
FIG. 1 illustrates an automatic laundry washing or washing/drying machine according to the present invention.

With reference to FIG. 1, an automatic laundry washing or washing/drying machine 1 comprises a control unit 2 which is configured to accept a user's vocal input, thus performing a speech recognition feature, and create a machine generated response when necessary. Nowadays, speech recognition systems are well known in the field of controlling tablet and smart phones, TV receivers and so on. Said automatic laundry washing or washing/drying machine 1 further comprises output means 5, 6 and a Human Interface Device (HID) controller 3, such as a keyboard or the like, for manually inputting data relative to the items loaded within the tub, useful especially in the case that speech recognition does not operate correctly.

The output means 5, 6 can comprises a loudspeaker 5 and/or a display device 6, such as a LED/OLED display panel or similar, for interacting with the user in relation to the washing cycle selected by the automatic laundry washing or washing/drying machine 1 in relation to the items loaded within the wash tub.

As an alternative, it is possible to replace both the HID controller 3 and the display device 6 with a single touch screen display also equipped with a loudspeaker 5 and microphone 4 (not shown in the drawings), which can provide the same functionalities in a single device without departing from the teachings of the present invention.

Figure 2:
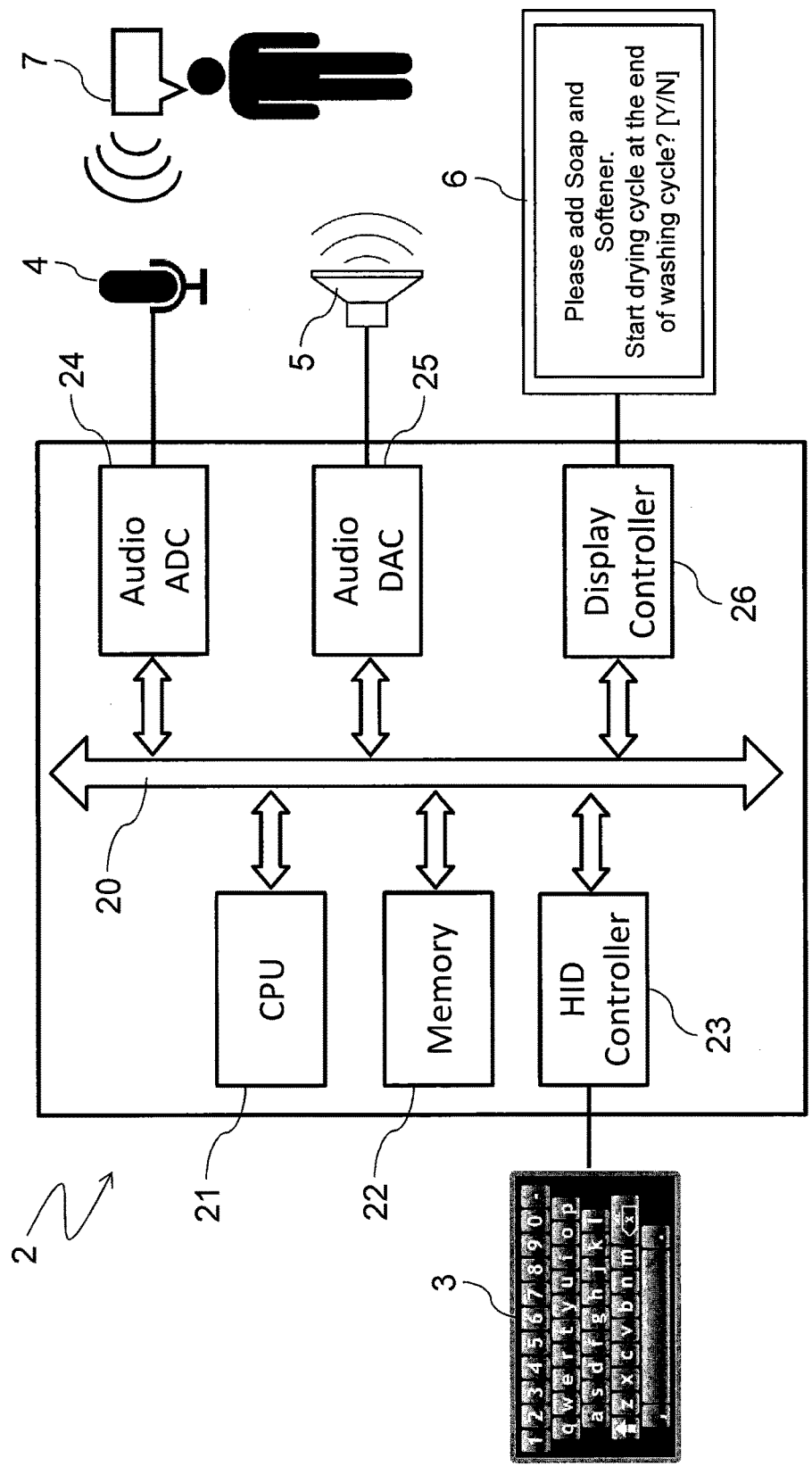
FIG. 2 illustrates a block diagram of a control unit providing speech recognition and response capabilities, to the laundry washing or washing/drying machine shown in FIG. 1.

With reference also to FIG. 2, control unit 2 of washing or washing/drying machine 1 incorporating speech recognition and response capabilities, is shown.

The control unit 2 comprises the following elements:
 data management means 21, indicated in the figure with the symbol CPU, and preferably comprising processing means, such as a CPU and/or DSP and/or the like, configured to read instructions contained in memory means 22 and to allow the proper operation of all the functions of the machine 1, in particular the speech recognition;
 the memory means 22 containing at least the instructions necessary for allowing the data management means 21 to carry out the phases of the method according to the invention, wherein said method will be better described during the present description, as well as the phases of speech recognition;
 a HID controller interface 23 in communication with the HID controller 3, so that, in a variant of the present invention, a user of the machine 1 can manually input the typology and the characteristics of the items loaded in the wash tub of said machine 1;
 a communication bus 20 which allows the exchange of information between the data management means 21, the memory means 22, the HID controller 23, and the remaining components comprised in the control unit 2.

Data management means 21 are simply indicated in the figure with the symbol CPU.

As an alternative to the communication bus 20, it is possible to connect the above-described components by means of a star type architecture, without departing from the teachings of the present invention.

In order to allow user-machine interactions, the washing or washing/drying machine 1 also comprises a microphone (microphone means) 4, suitable for transforming the speech of a human user in electrical signals apt to be managed by the control unit 2, so that it allows the user to vocally interact with said machine. In this way, the user may operate the machine 1 in a hands-free way.

For allowing voice interactions and speech recognition, the control unit 2 also comprises the following elements:
 an audio Analog to Digital Converter (Audio ADC) 24, which is in communication with the microphone 4, so as that said converter 24 can receive and sample user vocal inputs 7, in order to allow the data management means 21 to process the vocal inputs 7 and perform speech recognition;
 an audio Digital to Analog Converter (Audio DAC) 25, which is in communication with the loudspeaker 5, so as that the control unit 2 can generate audio and/or vocal responses which can be heard by the user. The user can also control the volume of the audio and/or vocal responses through traditional means;
 a display controller 26 connected to the display device 6 upon which written messages are displayed for assisting the user;
 wherein both the audio converters 24, 25 and the display controller 26 are in communication with the other elements of the control unit 2 preferably by means of the communication bus 20.

Operation of the automatic laundry or washing/drying machine 1 with speech recognition and response capabilities, according to the present invention results in being both rapid and user-friendly thanks to the above-described elements.

The washing or washing/drying machine 1, when using the speech recognition facilities of the invention, would enable a user to individually load the washing machine item by item as follows:
 enabling speech recognition on the washing machine by selecting a button or similar;
 loading the laundry items into the tub of the washing machine 1 item by item and vocally specifying for each individual item essential pieces of information such as the following:

i) typology of laundry item (e.g. shirt, bed linen, blue jeans, towel, etc.);
ii) color;
iii) typology of fabric (e.g. cotton, silk, wool, etc.) and/or intensity of color.
iv) level of dirtiness As said before, these essential pieces of information are the ones that influence the performance of washing programs of the machine 1. In fact, if items having very different typologies and characteristics are put together during a single washing program, the most delicate items, which require a delicate washing program, may be damaged.

By way of example, the user, during the loading process of the tub, can enounce or indicate the following list of items:
  a lightly soiled white cotton shirt;
  a heavily soiled light pink cotton shirt;
  a lightly soiled red hand towel;
  a heavy soiled pair of intense color blue jeans (with the risk of color loss).

With this information, the washing machine 1, based on its control unit 2, will be able to automatically calculate and determine the appropriate or best washing program from those available in the memory means 22 of the machine. These programs have been tested several times by the machine manufactured and memorized in a list of possible programs.

In a particular embodiment of the invention the washing programs memorized in the memory means 22 can be periodically updated through an interface, for instance using a USB port or a Wi-Fi connection or a wireless connection or the like in order to provide the user with a set of washing programs that are always the best ones available in connection with the improvements of detergents and/or energy saving rules and/or new washing tests made by the washing machine manufacturer.

As a possible further variation or feature of the invention, the washing machine 1, byway of an LCD screen or machine produced voice, can instruct the user how much detergent and softener to insert in the appropriate compartments of the machine or to take them automatically from an internal dispenser for several washes, or asking or suggesting the user if a drying process is required or the like, thus creating a true man-machine interaction.

The proposed washing or drying/washing machine 1 has the characteristic feature to instruct the user to remove a certain piece of laundry, previously identified thanks to the human interface device 4 apt to receive by the user information regarding the items to be washed, in particular the speech recognition facility, and inserting into the tub the laundry, item by item, in order not to jeopardize the quality of the wash or damage the contents of the load when all the items put together in a single wash cannot be properly washed together.

For instance, if the above-mentioned wash load is enounced or indicated and loaded in the tub of the machine 1, the output means 5, 6 will inform the user to remove the pair of intense color blue jeans.

In another example of operation of the machine 1, the user, during the loading process of the tub, can enounce or indicate the following list of items:
  a heavily soiled white cotton bed sheet;
  two heavily soiled white cotton handkerchiefs;
  three soiled white undershirts;
  a lightly soiled white silk blouse;
  a lightly soiled red woolen sweater.

After the above-mentioned wash load is enounced or indicated and loaded in the tub of the machine 1, the output means 5, 6 will inform the user to remove the lightly soiled white silk blouse and the a lightly soiled red woolen sweater.

More examples of erroneous wash loads can be made. All of them however share this common critical point: the essential pieces of information characterizing each item inserted in the wash tub of the machine 1 allow for recognizing in the wash load the presence of laundry items that cannot be washed properly. This also means that, if a proper washing of all the items has to be obtained, some conflicting items should be removed, otherwise they will be certainly damaged.

In order to make possible the use of the automatic laundry washing machine 1 even by people who are not able to or do not want to take advantage of the speech recognition method according to the invention, the user can load the tub without enabling speech recognition, as per traditional washing machines.

Summarizing, the laundry washing or washing/drying machine 1 comprising:
  a wash tub,
  an human interface device 4 apt to receive by a user information regarding the items to be washed, in particular comprising a microphone 4 suitable for transducing the voice of the user in electrical signals;
  a control unit 2 which is in communication with said human interface device, and comprises:
    memory means 22 containing at least a set of washing programs and instructions for controlling the operation of said machine 1,
    data management means 21 configured for acquiring information about laundry items introduced into the wash tub and for selecting a washing program from said set of washing programs on the basis of said information about the laundry items,
  output means 5, 6 which are in communication with the control unit 2,
  wherein the user introduces into the wash tub the items to be washed, specifying for each item essential information comprising a typology (bed linen, shirts, underwear, etc.) and a description of its characteristics, in particular the type of fabric, the degree of soil, the color and its intensity, said essential information being given by the user through said human interface 4, memorized in said memory means 22 and used for determining the most appropriate washing program among said set of washing programs, chosen taking into account the items singularly specified through said essential information when they are introduced in said wash tub and wherein the data management means 21 are also configured for reporting to the user, by means of said output means 5, 6, the presence of at least a conflicting laundry item into the wash tub, after having determined on the basis of said essential information which conflicting laundry item is unsuitable to be washed by means of the selected washing program.

Figure 3:
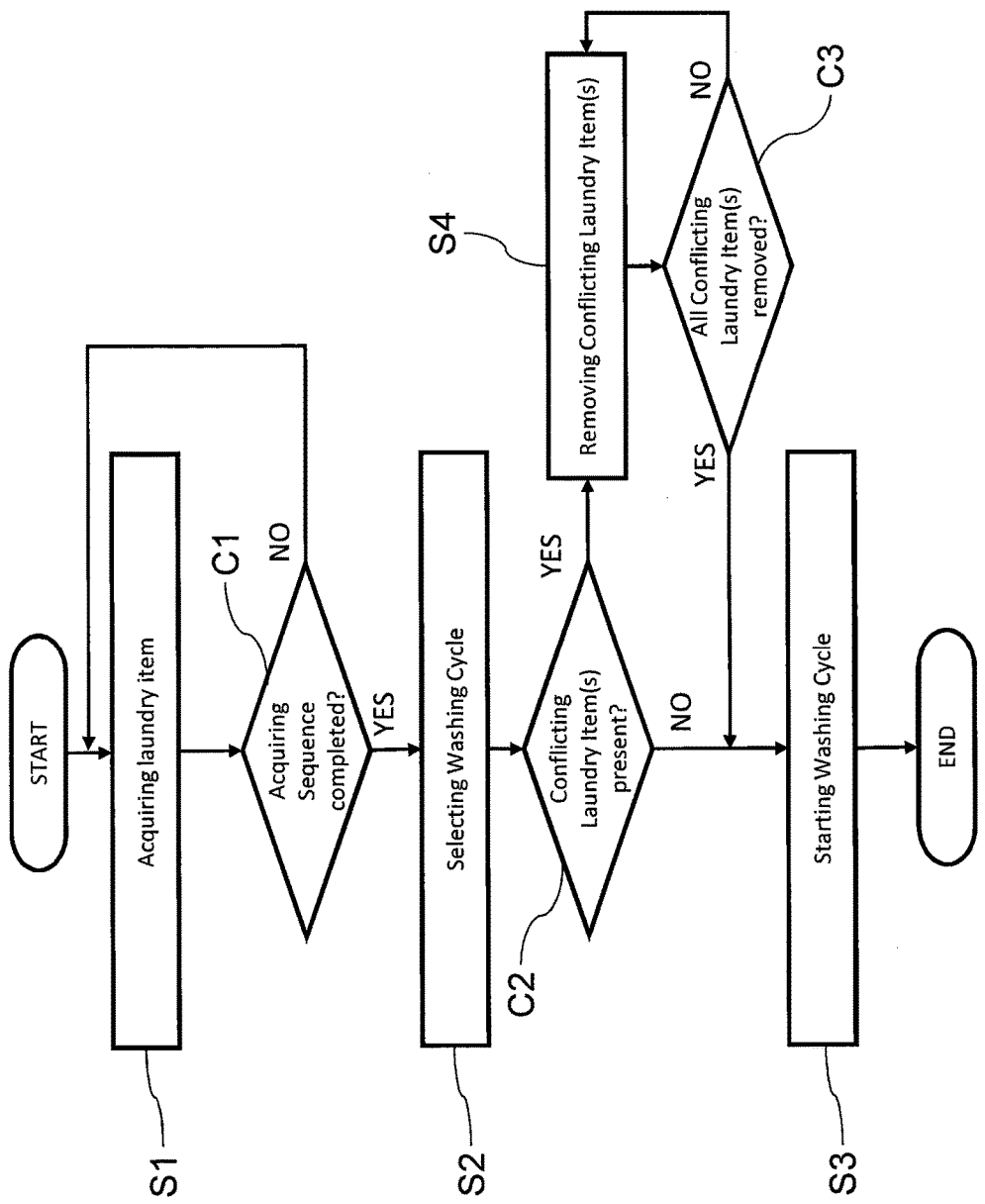
FIG. 3 illustrates an operational flow chart representing the operation of the control unit shown in FIG. 2.

With reference also to FIG. 3, a flow chart illustrating an implementation of the above mentioned operational mode described and applied to the automatic laundry washing machine 1 according to the invention, also comprises the following states:
  an acquisition of a laundry item state S1, during which the washing machine 1 operates according to the method of the present invention, making it possible for the user to individually insert items of laundry, identifying them item by item, in the washing machine 1 providing essential information that describes the typology of each laundry item inserted in the drum by enouncing or indicating essential pieces of information like the following:
i) typology of laundry item (e.g. shirt, bed linen, blue jeans, towel, etc.);
ii) color;
iii) typology of fabric (e.g. cotton, silk, wool, etc.) and/or intensity of color;
iv) level of dirtiness;

an automatic selection of the washing cycle/program state S2, during which the control unit 2 of the washing machine 1 will be able to automatically calculate and select the appropriate or best washing program from those available in its internal memory means 22. These programs have been tested several times before and during manufacture of the machine and memorized in a list of possible programs. If during this operational state the machine identifies conflicting laundry items that may jeopardize the washing cycle or damage items of laundry, the washing machine will then operate the subsequent state;

a remove conflicting laundry item(s) state S4, during this state the washing machine 1 will instruct the user, byway of audio/visual/vocal instructions 5 or by an appropriate display device 6, to remove said conflicting item(s) of laundry from the drum. The washing cycle/program of state S2 will not initiate until said item(s) of conflicting laundry is removed;

an activation state S3, during which the washing machine 1 starts the washing cycle/program selected during state S2.

When the washing machine 1 is in a working condition and the speech recognition is enabled, the control unit 2 enters in the state S1.

During the time in which the washing machine 1 remains in this state S1, the washing machine verifies that an item of laundry has been introduced by the user and that a vocal description of the item introduced has been provided (option block C1), for example considering that the procedure for introducing items of laundry is finalized when the user inputs a command, such as "Start Wash", either vocally by way of the microphone 4, or manually by way of the keyboard 3, or by way of a dedicated key, such as a Start key, not illustrated in the figures. In the case in which an appropriate command, such as "Start Wash" has not been entered by the user, the method returns to state S1, and the previously inputted essential information identifying the laundry item, if any, is stored in the memory means 22. On the other hand, if the machine successfully recognizes a user command, such as "Start Wash" the washing machine 1 will pass on to the successive state S2 and select the most appropriate washing cycle/program from its internal memory 22, based on the items of laundry introduced and vocally, or manually described, item by item, by the user. Before initiating the appropriate washing cycle/program, the washing machine 1 calculates whether the user has introduced an item or items of conflicting laundry that could jeopardize the washing cycle/program and/or damage the laundry (option block C2). If the control unit 2 of the washing machine 1 identifies the presence of conflicting laundry item(s), it will instruct the user to remove the conflicting item(s) byway of vocal/visual instruction, announced through the loudspeaker 5 and/or text messages displayed on the display panel 6. The washing cycle/program will not initiate until the control unit 2 is satisfied that the conflicting item has been removed; the user would confirm removal by way of inputting a vocal/manual command, making use of the microphone 4, or by manually inputting confirmation of removal, byway of the keyboard 3, answering a Yes/No type question relative to the conflicting item being removed announced through the loudspeaker 5 and/or displayed on the display device 6. When the control unit 2 is satisfied that the conflicting item of laundry has been removed, the machine will go into state S3 and the most appropriate washing cycle/program for the items of laundry introduced by the user (and present into the wash tub) will initiate. It is to be noted that during the operational process described herein, the washing machine will interact with the user, either vocally, by way of the loudspeaker 5 and/or the display device 6, asking and/or suggesting processes, such as "Add soap/detergent", "Is softener necessary", "Start drying cycle at the end of the washing cycle", etc. It is moreover noted that the detergent and/or softener may be manually introduced by the user or be automatically measured and introduced during the washing cycle by way of appropriate internal dispensers.

After the activation state S3 is finalized, the washing machine 1 will exit the operational procedure and end the cycle by automatically turning itself off.

Summarizing, the method for operating a laundry washing or washing/drying machine 1 according to the invention comprises the following phases:
a. specifying essential information regarding the list of laundry items individually inserted in the machine by means of a human interface, in particular a speech recognition facility;
b. selecting a washing program from a list of washing programs based on said essential information identifying the characteristics of laundry items;
c. reporting to the user, whenever necessary, the presence of at least a conflicting laundry item from the laundry items inserted within the tub of the washing/drying machine, wherein said conflicting laundry item is unsuitable to be properly washed together with the other items by means of the selected washing program.

Assuming that in a wash load there are NI items and the machine 1 can select between NP available washing programs, the conflicting items can be found (during the phases a., b. and c. of the above-mentioned method), for instance, by means of an algorithm that executes the following phases:
a) computing, for each laundry item, the value of a likelihood function that a specific laundry item, identified by its essential information, will result properly cleaned without being damaged by a certain washing program (this phase produces a NI×NP matrix of real numbers);
b) selecting (from the NI×NP matrix), for each item, the washing program(s) for which the value of the likelihood function assumes the highest value (this phase produces a NI×NP matrix of Boolean values, wherein each value is equal to TRUE if the likelihood value has the highest value for a certain program, otherwise the value is equal to FALSE);
c) selecting, among the NP washing programs, the washing program for which the values of the likelihood functions show the highest value for the largest number of items (this phase corresponds to select the washing program corresponding to the column of the matrix, produced at the end of phase b., which contains the highest number of TRUE). In the case more than one washing programs are selected, the first one can be selected. The washing program selected at the end of this phase is the same selected at the end of phase b. of the above-mentioned method;

d) selecting the laundry item(s) for which the program selected during phase c. is unsuitable (this phase corresponds to select, from the column corresponding to the selected washing programs, the items corresponding to the row for which the Boolean value is FALSE). The selected laundry item(s) is/are the same reported at the end of phase c. of the above-mentioned method.

The proper likelihood functions for operating the laundry machine 1 in a proper way should be provided by the manufacturer of said machine 1.

The skilled person may use a different algorithm from the one described above without departing from the teachings of the present invention.

The use of an operational procedure as described herein above allows for creating a simple, user friendly washing cycle/program wherein the user can instruct the washing machine 1 vocally and the washing machine can interact with the user whenever necessary with questions and/or instructions.

Technicians of the art may use a different recognition interface with regards to that described hereinabove, without however for this departing from the teachings of the present invention. For instance in the above description reference has been made to a washing machine where the wash tub is provided with an internal drum for accepting items to be washed. It is clear that the invention also works in the case where instead of a drum, the wash tub is provided with an agitator or similar means for washing items.

The technician of the art may be able to create an automatic washing machine 1 incorporating selection of a washing cycle/program based on the identification of individual items of laundry different from that described hereinabove, without for this departing from the teachings of the present invention.

In fact the basic concept of the present invention is the fact that through the identification of the typology and the different characteristics of the items to be washed, made item by item, it is possible to ascertain if, in the mix of items loaded in the wash tub of the machine, there are conflicting items which render impossible to perform a good washing program or can damage one or more of the loaded items. In this way, the user can be informed of such situation by announcing or displaying which items have to be removed, in order to perform a good washing program without incurring in the risk of damaging some of the items to be washed.

In a variation of the invention, the user may be able to store habitual washing programs in the internal memory means 22 of the washing machine 1 and allocate a dedicated program phrase, such as "Wash Cycle One"; upon calling the stored washing program the washing machine 1 would interact with the user, either vocally, by way of the loudspeaker 5 or by way of the display panel, with a list of laundry items associated to such stored program and wait for confirmation from the user before initiating the desired washing cycle/program. In any case, in presence of items in conflict with the type of selected program, the machine will inform the user about the fact that this/these item/s cannot be washed properly, and has/have to be removed from the wash tub.

The operational procedure, system and method described herein by way of an example may be subject to many possible variations without departing from the novelty spirit of the present idea; it is also clear that in the practical implementation of the invention the illustrated details may have different devices or be replaced with other technically equivalent elements, as well as providing different sequences or steps.

It can therefore be easily understood that the present invention is not limited to the above described machine, system and method, but may be subject to many modifications, improvements or replacements of equivalent parts and elements without departing from the inventive idea, as clearly specified in the following claims.

While this invention has been described in conjunction with the specific embodiments outlined above, it is evident that many alternatives, modifications, and variations will be apparent to those skilled in the art. Accordingly, the preferred embodiments of the invention as set forth above are intended to be illustrative, not limiting. Various changes may be made without departing from the spirit and scope of the inventions as defined in the following claims.

The invention claimed is:

1. A laundry washing or washing/drying machine comprising:
   a wash tub;
   an human interface device configured to receive, from a user, information regarding items to be washed;
   a control unit that is in communication with said human interface device, the control unit comprising:
      a memory means storing at least a set of washing programs and instructions for controlling the operation of said machine; and
      a data management means configured for acquiring information about laundry items introduced into the wash tub and for selecting a washing program from said set of washing programs on the basis of said information about the laundry items; and
   an output means that is in communication with the control unit;
   wherein the human interface device is configured to receive information specifying, for each of the items to be washed, essential information comprising:
      a typology of the items; and
      a description of the item's characteristics;
   wherein said memory means is configured to store the essential information; and
   wherein, based on the essential information, the data management means is configured to:
      determine a washing program among said set of washing programs, taking into account items singularly specified through said essential information when they are introduced in said wash tub;
      determine, based on said essential information, if a conflicting laundry item, which is unsuitable to be washed by the selected washing program, has been introduced into the wash tub; and when it is determined that a conflicting laundry item has been introduced into the wash tub, report to the user, by means of said output means, that the conflicting laundry item is in the wash tub.

2. The machine according to claim 1;
   wherein the control unit is configured to start the selected washing program only after the user has confirmed that said conflicting laundry item has been removed from the tub.

3. The machine according to claim 2, further comprising:
   a Human Interface Device ("HID") controller; wherein the human interface device is configured to accept an input from the user specifying that the conflicting laundry item has been removed.

4. The machine according to claim 3;
wherein the control unit, in order to improve the effectiveness of the selected washing program, is configured to ask questions to the user about which action has to be made by the user or implemented by the machine by means of said output means; and
wherein the human interface device is configured to accept answers, to the questions asked by the control unit, from the user.

5. The machine according to claim 1, further comprising:
a speech recognition facility configured to recognize, through a microphone and the control unit, speech from the user specifying the essential information for each item introduced into the wash tub.

6. The machine according to claim 5;
wherein the speech recognition facility is further configured to recognize speech from the user specifying that the conflicting laundry item has been removed.

7. The machine according to claim 1;
wherein both a predefined list of laundry items and a washing program associated to said predefined list are stored into said memory means, in a way that the user can recall them by means of said human interface device.

8. The machine according to claim 1;
wherein said output means comprises a loudspeaker.

9. The machine according to claim 1;
wherein said output means comprises a display device.

10. The machine according to claim 1;
wherein said human interface device comprises;
a touch screen displays;
a loudspeaker; and
a microphone.

11. The machine according to claim 5;
wherein said control unit comprises an analogue digital converter ("ADC") and/or an audio digital analogue converter ("DAC") for implementing said speech recognition facility, a response capability by the machine, or a combination thereof.

12. The machine according to claim 1, further comprising:
an interface configured to periodically receive updates to said washing programs stored in said memory means.

13. A method for operating a laundry washing or washing/drying machine, the method comprising the phases of:
specifying essential information by means of a human interface device identifying characteristics or laundry items individually inserted in the machine;
selecting a washing program by means of a data management means configured for acquiring information about laundry items introduced into the wash tub and for selecting a washing program from said set of washing programs on the basis of said information about the laundry items;
determining, based on the essential information, if a conflicting laundry item, which is unsuitable to be washed by the selected washing program, has been inserted into the machine by means of said data management means; and
reporting to a user that the conflicting laundry item is present in the machine by means of an output means.

14. The method according to claim 13;
wherein, when it is determined that a conflicting laundry item has been inserted into the machine, the method further comprises starting the selected washing program only after the user has confirmed that the conflicting laundry item has been removed from the machine.

15. The method according to claim 13, further comprising: a speech recognition phase wherein, for each item inserted in the machine, the user specifies said essential information, the speech recognition phase comprising introducing of the items and descriptions of the characteristics of the items through a microphone and said control unit.

16. The method according to claim 13;
wherein said list of washing programs is stored in a memory means of the machine; and
wherein the method further comprises periodically updating the list of washing programs through an interface of the machine.

17. The method according to claim 14;
wherein, when it is determined that a conflicting laundry item has been inserted into the machine, the method further comprises vocally specifying that the conflicting laundry item has been removed from the machine.

18. The method according to claim 13;
wherein, when it is determined that a conflicting laundry item has been inserted into the machine, the method further comprises specifying that the conflicting laundry item has been removed by mean of a human interface device.

19. The method according to claim 13, further comprising:
recalling both a predefined list of laundry items and a washing program associated to said predefined list by means of a predefined vocal command.

20. A laundry washing or washing/drying machine comprising:
a wash tub;
a microphone configured to transduce a voice of a user in electrical signals;
a control unit that is in communication with said microphone, the control unit comprising:
a memory means storing at least a set of washing programs and the instructions for operating said machine;
a data management means configured to: acquire information about laundry items introduced into wash tub; and
to select a washing program from said set of washing programs based on said information about the laundry items;
an output means that is in communication with the control unit;
wherein the information about the laundry items includes essential information for each laundry item comprising:
a typology of the laundry item; and
a description of the laundry item;
wherein said essential information is provided by the user through said microphone, stored in said memory means, and utilized to select a washing program among said set of washing programs, and
wherein the data management means is also configured to:
determine, based on said essential information, if a conflicting laundry item, which is unsuitable to be washed by the selected washing program, has been introduced into the wash tub; and
when it is determined that a conflicting laundry item has been introduced into the wash tub, report to the user, by means of said output means, that the conflicting laundry item is in the wash tub.

\* \* \* \* \*